(12) United States Patent
Halimaoui et al.

(10) Patent No.: US 8,975,682 B2
(45) Date of Patent: Mar. 10, 2015

(54) INTEGRATED CIRCUIT COMPRISING A CAPACITOR WITH HSG METAL ELECTRODES

(75) Inventors: Aomar Halimaoui, La Terrasse (FR); Rebha El Farhane, Grenoble (FR); Benoit Froment, Brussels (BE)

(73) Assignee: STMicroelectronics (Crolles 2) SAS, Crolles (FR)

( * ) Notice: Subject to any disclaimer, the term of this patent is extended or adjusted under 35 U.S.C. 154(b) by 992 days.

(21) Appl. No.: 12/861,256

(22) Filed: Aug. 23, 2010

(65) Prior Publication Data

US 2010/0320567 A1 Dec. 23, 2010

Related U.S. Application Data

(62) Division of application No. 11/570,731, filed as application No. PCT/FR2005/001400 on Jun. 7, 2005, now Pat. No. 7,781,296.

(30) Foreign Application Priority Data

Jun. 18, 2004 (FR) ..................................... 04 06674

(51) Int. Cl.
*H01L 29/94* (2006.01)
*H01L 27/108* (2006.01)
*H01L 49/02* (2006.01)

(52) U.S. Cl.
CPC ................ *H01L 28/84* (2013.01); *H01L 28/90* (2013.01)
USPC ............. 257/309; 257/E21.013; 257/E21.199

(58) Field of Classification Search
CPC ... H01L 28/82; H01L 28/84; H01L 21/28518; H01L 29/665; H01L 21/28052
USPC .......................... 257/309, E21.013, E21.199
See application file for complete search history.

(56) References Cited

U.S. PATENT DOCUMENTS

| | | | |
|---|---|---|---|
| 5,447,878 A * | 9/1995 | Park et al. ..................... 438/396 |
| 5,656,529 A | 8/1997 | Fukase | |
| 5,741,734 A | 4/1998 | Lee | |
| 5,998,824 A | 12/1999 | Lee | |
| 6,033,967 A * | 3/2000 | Li et al. .......................... 438/398 |
| 6,143,617 A | 11/2000 | Shue et al. | |
| 6,255,159 B1 * | 7/2001 | Thakur ......................... 438/253 |
| 6,291,289 B2 * | 9/2001 | Rhodes et al. ................ 438/239 |
| 6,348,708 B1 | 2/2002 | Lee et al. | |

(Continued)

FOREIGN PATENT DOCUMENTS

| | | |
|---|---|---|
| CN | 1 427 463 | 7/2003 |
| JP | 03-230561 A | 10/1991 |
| JP | 10-233493 | 9/1998 |

OTHER PUBLICATIONS

Banerjee, et al. "Fabrication and Performance of Selective HSG Storage Cells . . . ", IEEE Transactions on Electron Devices, vol. 47, No. 3 (Mar. 2000).

*Primary Examiner* — Jerome Jackson, Jr.
*Assistant Examiner* — Paul Budd
(74) *Attorney, Agent, or Firm* — Seed IP Law Group PLLC

(57) ABSTRACT

An integrated circuit (IC) includes at least one capacitor with metal electrodes. At least one of the electrodes (10 or 30) is formed from at least surface-silicided hemispherical grain silicon or silicon alloy. A fabrication process for obtaining such a capacitor with silicided metal electrodes is also provided.

7 Claims, 3 Drawing Sheets

(56) References Cited

U.S. PATENT DOCUMENTS

| | | |
|---|---|---|
| 6,682,970 B1 | 1/2004 | Thakur et al. |
| 6,998,307 B2 * | 2/2006 | Sell et al. ............. 438/243 |
| 2002/0006708 A1 * | 1/2002 | Kang et al. ............. 438/399 |
| 2002/0020866 A1 | 2/2002 | Lee et al. |
| 2003/0020122 A1 | 1/2003 | Joo et al. |
| 2003/0038325 A1 | 2/2003 | Sugawara et al. |
| 2003/0123216 A1 * | 7/2003 | Yoon et al. ............. 361/303 |
| 2003/0207532 A1 * | 11/2003 | Chudzik et al. ............. 438/243 |
| 2004/0132259 A1 | 7/2004 | Yang et al. ............. 438/305 |
| 2004/0245560 A1 | 12/2004 | Pontoh et al. |
| 2007/0020870 A1 | 1/2007 | Sandhu ............. 438/387 |

\* cited by examiner

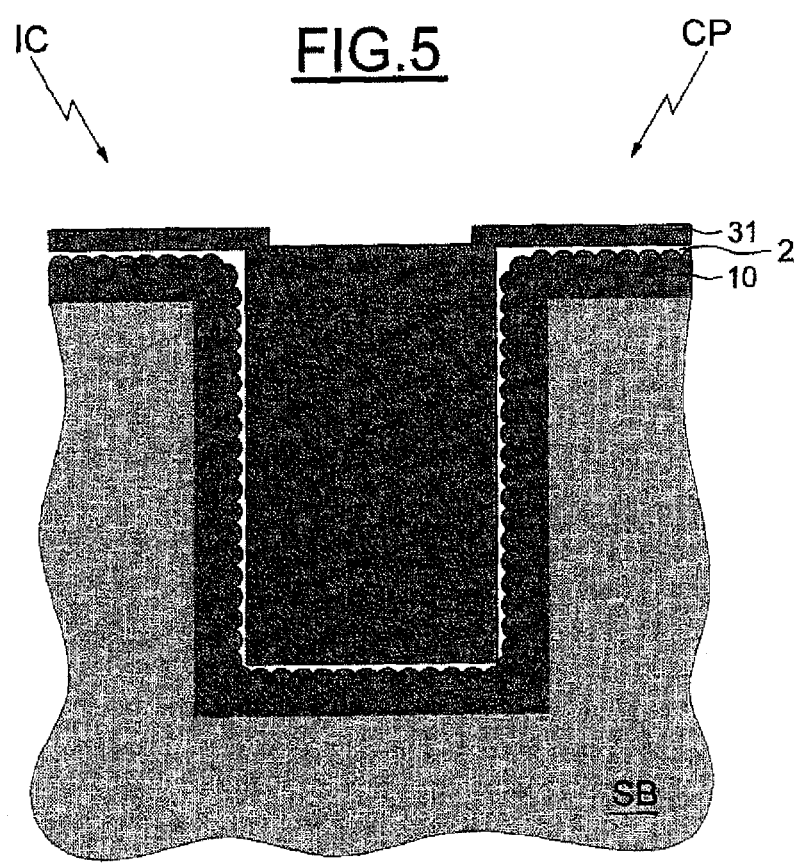

INTEGRATED CIRCUIT COMPRISING A CAPACITOR WITH HSG METAL ELECTRODES

CROSS-REFERENCE TO RELATED APPLICATIONS

This application is a divisional of U.S. patent application 11/570,731, filed on Dec. 15, 2006, which is the National Stage of International Application No. PCT/FR2005/001400 filed on Jun. 7, 2005, which is based upon and claims priority from prior French Patent Application No. 0406674 filed Jun. 18, 2004, the entire disclosure of which is herein incorporated by reference.

BACKGROUND OF THE INVENTION

1. Field of the Invention

The present invention relates to integrated circuits, more particularly to capacitors with metal electrodes. The capacitors are used especially in memory cells of a memory plane.

2. Description of Related Art

The fabrication of capacitors is increasingly faced with problems associated with the high integration densities. This is because the increase in integration density means a reduction in the area of a memory cell, while still maintaining an effective capacitance. Thus, in current technologies, several approaches are possible.

The most common approach is the formation of the capacitor in a trench, allowing the area of the capacitor to be increased without increasing the area of the memory cell. The area may be further increased by a factor of about 2 by using, as lower electrode, doped polysilicon of the HSG (Hemispherical Grain) polysilicon type.

For even higher integration densities, there are several possible approaches that allow capacitors to be integrated into smaller and smaller cells.

The conventional approach consists in increasing the depth of the trench. However, this approach leads to form factors that cannot be easily controlled. Another approach consists in reducing the thickness of the dielectric, the risk being an increase in the leakage current.

Recent research has been carried out on the use of an insulator with a high dielectric constant and metal electrodes, making it possible to overcome the problems of doping three-dimensional polysilicon electrodes and to reduce the depletion capacitances associated with polysilicon electrodes. However, the conventional metal electrodes (for example made of TiN) are plane and their use therefore results in the factor of 2 provided by the use of a HSG polysilicon being lost.

SUMMARY OF THE INVENTION

The invention aims to provide a solution to these problems.

One object of the present invention is to obtain capacitors of size matched to integrated circuits of increasingly small size without reduction in their capacitance.

Another object of the present invention is to use metal electrodes that allow the doping and depletion capacitance problems associated with three-dimensional polysilicon electrodes to be overcome, while still maintaining the deposition morphology of the hemispherical grain type.

The capacitors according to the present invention also afford the advantage of having an effective capacitance without an increase in the leakage current of the dielectric.

The present invention is therefore based on the silicidization (metal silicide formation) of, for example, an HSG polysilicon electrode.

The present invention therefore proposes an integrated circuit comprising at least one capacitor with metal electrodes, at least one of the two electrodes of the capacitor of which is formed from at least surface-silicided hemispherical grain silicon or silicon alloy.

This electrode may thus be either partially silicided or, preferably, entirely silicided, i.e. entirely formed from a metal silicide.

According to a second embodiment of the invention, the second metal electrode of the capacitor is also formed from a partially or entirely silicided layer of hemispherical grain silicon or silicon alloy.

As a variant, the second electrode of the capacitor may include a metal layer, for example a TiN layer.

The capacitor may have a planar structure or else a trench structure.

The present invention also proposes a process for fabricating a capacitor within an integrated circuit as defined above, in which the production of the first electrode comprises the formation of a layer of hemispherical grain silicon or silicon alloy and the at least surface silicidization of the said layer.

This process makes it possible to obtain a capacitor in which the said first electrode may be either partially silicided or, preferably, entirely silicided.

According to a variant of the invention, the second electrode is either produced in a similar manner to the first electrode, that is to say by the deposition of hemispherical grain polysilicon followed by silicidization, or by depositing metal, for example TiN.

Other advantages and features of the invention will become apparent on examining the detailed description of embodiments and methods of implementation, which are in no way limiting, and the appended drawings, in which:

BRIEF DESCRIPTION OF THE DRAWINGS

FIG. 5 shows schematically an integrated circuit according to a second embodiment of the present invention.

DETAILED DESCRIPTION

Figure 1:
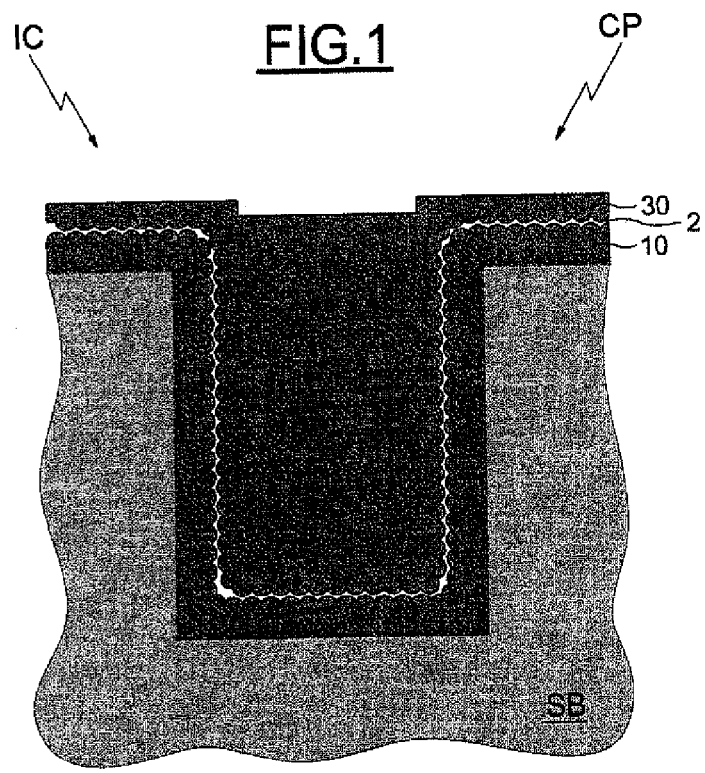
FIG. 1 shows schematically an integrated circuit according to a first embodiment of the present invention.

FIG. 1 shows an integrated circuit IC according to the invention, which comprises a capacitor CP having two hemispherical-grain silicided metal electrodes.

The integrated circuit IC includes a substrate SB in which a hollow trench has been formed, comprising a first hemispherical-grain silicided metal electrode 10, covered by a dielectric 2, covered by a second hemispherical-grain silicided metal electrode 30.

The main steps of a method of implementing the process according to the invention, allowing the capacitor of FIG. 1 to be obtained, will now be described in greater detail.

Figure 2:
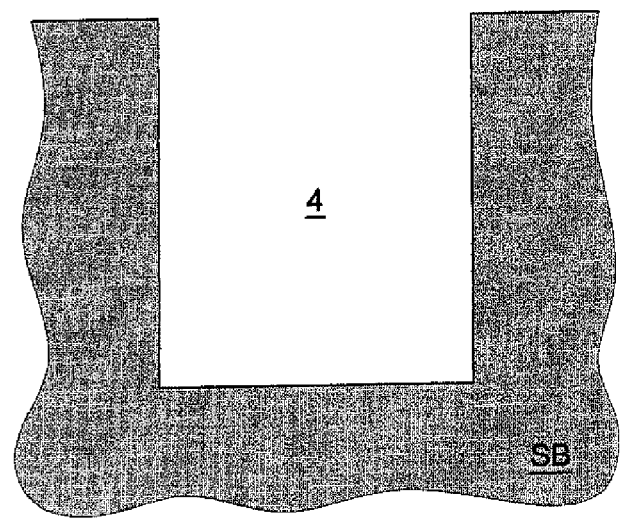
FIGS. 2 to 4 illustrate schematically the main steps of a process for obtaining the integrated circuit of FIG. 1.

In FIG. 2, the reference SB therefore denotes a semiconductor substrate, for example made of silicon. A trench 4 is formed in the substrate SB in a conventional manner known per se.

Figure 3:
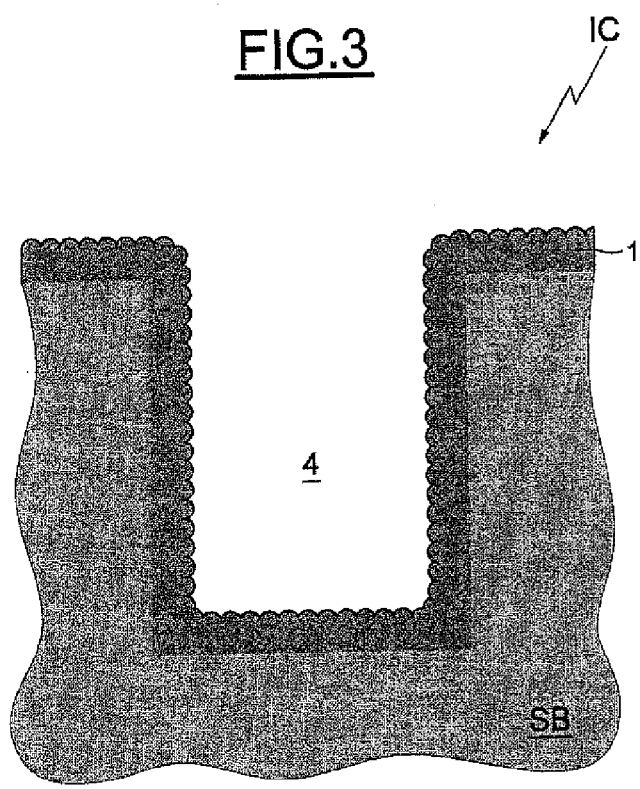

The next step of the process is the formation of the first electrode 10. To do this, a layer 1 of hemispherical grain silicon, germanium or silicon alloy, such as for example a silicon-germanium alloy, is formed, also in a conventional manner known per se, for example by deposition (FIG. 3). The characteristics of such a deposition are described for example in "*Fabrication and performance of selective HSG storage cells for* 256 *Mb and* 1 *Gb DRAM applications*", A. Banerjee, R. L. Wise, D. L. Plunton, M. Bevan, M. L. Crenshaw, S. Aoyama and M. M. Mansoori, IEEE Transactions on Electron Devices, Vol. 47, No. 3, March 2000.

By way of indication, the layer 1 of hemispherical grain silicon or silicon alloy has a thickness of 1000 to 1500 Å.

In the example described here, the silicidization, that is to say the formation of a metal silicide, is obtained from cobalt. However, this silicidization may be obtained using other metals, such as for example tungsten, titanium or nickel.

A nickel layer is deposited, for example by plasma vapour deposition (PVD), on the layer 1 of hemispherical grain silicon or silicon alloy.

Of course, the thickness of the nickel layer is determined according to the phase and the thickness of the final metal silicide that it is desired to obtain, knowing that when nickel is used, 1 Å of nickel gives 2.2 Å of silicide.

Figure 4:
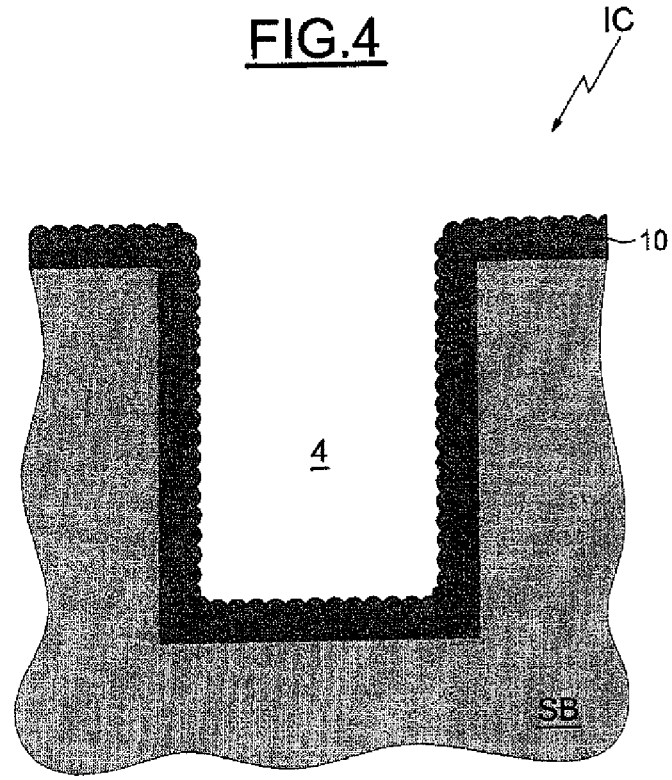

Next, a first initial annealing operation is carried out, typically at a temperature below 600° C., for example at a temperature of 450° C. This annealing temperature depends on the nature of the material used for the silicidization. The nickel then reacts with the silicon of the layer 1 to form NiSi (FIG. 4).

The excess nickel that has not reacted may then be removed, selectively with respect to the silicide. This selective removal operation is carried out, for example, by wet etching. Such wet etching is conventional and known per se, and it uses for example an $H_2SO_4/H_2O_2/H_2O$ chemical etchant or else an $HCl/H_2O_2/H_2O$ chemical etchant.

What is therefore produced is a silicided metal electrode 10 with a hemispherical grain morphology on which the dielectric 2 is deposited.

The dielectric may be a conventional dielectric, with a relative dielectric constant k of 5 for example. In this case, the main improvement over the prior art comes from the improvement in deletion capacitance, from the great reduction in series resistance and from the simplification of the process, in so far as it is unnecessary to dope, by implantation, silicon or silicon alloy electrodes, this operation sometimes being particularly difficult on the sidewalls of trenches.

It is also possible to use dielectrics with a high dielectric constant, for example hafnium oxide $HfO_2$ (k=17), which further increases the capacitance of the capacitor.

The dielectric 2 is covered with the second electrode. As illustrated in FIG. 1, the electrode 30 may be formed in a manner similar to the first electrode 10, that is to say by the deposition of HSG polysilicon, then silicidization, preferably complete silicidization, and the removal of the unreacted metal.

The second electrode may also be formed for example by depositing metal (for example TiN) directly on the dielectric. In this case (FIG. 5), the capacitor comprises a first hemispherical-grain silicided metal electrode 10 covered by a dielectric 2 covered by a second metal electrode 31.

In the integrated circuits according to the present invention, the capacitors are not limited to trench structures, such as those described above, but may also be for example of the planar type.

What is claimed is:

1. An integrated circuit comprising:
    a semiconductor substrate having a trench, the trench comprising sidewalls and a bottom; and
    at least one capacitor in the trench, the capacitor including first and second metal comprising electrodes, and a dielectric layer located between the first and second electrodes,
    wherein the first electrode of the capacitor comprises hemispherical grain silicon or hemispherical grain silicon alloy on the sidewalls and bottom of the trench, the hemispherical grain silicon or hemispherical grain silicon alloy being completely silicided,
    a surface of the completely-silicided hemispherical grain silicon or hemispherical grain silicon alloy of the first electrode directly contacts the dielectric layer of the capacitor, and
    the second electrode of the capacitor comprises at least surface-silicided hemispherical grain silicon or hemispherical grain silicon alloy.

2. The integrated circuit according to claim 1, wherein the hemispherical grain silicon or hemispherical grain silicon alloy of the second electrode of the capacitor is completely silicided.

3. The integrated circuit according to claim 1, wherein the second electrode of the capacitor comprises a silicided metal layer.

4. An electronic device comprising a plurality of integrated circuits, at least one of the integrated circuits comprising:
    a semiconductor substrate having a trench, the trench comprising sidewalls and a bottom; and
    at least one capacitor in the trench, the capacitor including first and second metal comprising electrodes, and a dielectric layer located between the first and second electrodes,
    wherein the first electrode of the capacitor comprises hemispherical grain silicon or hemispherical grain silicon alloy on the sidewalls and bottom of the trench, the hemispherical grain silicon or hemispherical grain silicon alloy being completely silicided,
    a surface of the completely-silicided hemispherical grain silicon or hemispherical grain silicon alloy of the first electrode directly contacts the dielectric layer of the capacitor, and
    the second electrode of the capacitor comprises at least surface-silicided hemispherical grain silicon or hemispherical grain silicon alloy.

5. A capacitor within an integrated circuit, the capacitor comprising:
    a semiconductor substrate having a trench, the trench comprising sidewalls and a bottom;
    a first electrode in the trench, the first electrode comprising a layer of hemispherical grain silicon or hemispherical grain silicon alloy on the sidewalls of the trench and on the bottom of the trench, wherein the layer of hemispherical grain silicon or hemispherical grain silicon alloy on the sidewalls of the trench and on the bottom of the trench is completely silicided;
    a dielectric in the trench, wherein a silicide surface of the first electrode directly contacts the dielectric; and
    a second electrode in the trench, wherein the dielectric is located between the first and second electrodes, and the second electrode of the capacitor comprises at least surface-silicided hemispherical grain silicon or hemispherical grain silicon alloy.

6. The capacitor within an integrated circuit of claim 5, wherein the dielectric is hafnium oxide.

7. The capacitor within an integrated circuit of claim 5, wherein the second electrode comprises titanium.

\* \* \* \* \*